(12) United States Patent
Nakamura et al.

(10) Patent No.: US 10,683,867 B2
(45) Date of Patent: Jun. 16, 2020

(54) VACUUM VALVE, VACUUM PUMP, AND VACUUM PUMPING SYSTEM

(71) Applicant: SHIMADZU CORPORATION, Kyoto (JP)

(72) Inventors: Masaya Nakamura, Kyoto (JP); Junichiro Kozaki, Kyoto (JP); Atsuo Nakatani, Kyoto (JP); Nobuyuki Hirata, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 140 days.

(21) Appl. No.: 15/863,886

(22) Filed: Jan. 6, 2018

(65) Prior Publication Data

US 2018/0195518 A1    Jul. 12, 2018

(30) Foreign Application Priority Data

Jan. 12, 2017 (JP) ................................ 2017-003444

(51) Int. Cl.
*F04D 27/00* (2006.01)
*H01L 21/67* (2006.01)
*F16K 51/02* (2006.01)
*F16K 31/04* (2006.01)
*F16K 3/06* (2006.01)
*F04D 19/04* (2006.01)
*F04D 25/06* (2006.01)
(Continued)

(52) U.S. Cl.
CPC ......... *F04D 27/002* (2013.01); *F04D 19/048* (2013.01); *F04D 27/001* (2013.01); *F16K 3/06* (2013.01); *F16K 31/041* (2013.01); *F16K 51/02* (2013.01); *H01L 21/67017* (2013.01); *F04D 25/06* (2013.01); *F04D 29/403* (2013.01); *F16K 3/04* (2013.01)

(58) Field of Classification Search
CPC ...... F16K 51/02; F04D 27/001; F15B 20/002; F15B 19/005
USPC .................................................... 251/129.02
See application file for complete search history.

(56) References Cited

U.S. PATENT DOCUMENTS

2009/0007574 A1    1/2009   Amundsen
2011/0174380 A1    7/2011   Itafuji
(Continued)

FOREIGN PATENT DOCUMENTS

CN    103912720 A    7/2014
JP    1988149486 A   6/1988
(Continued)

OTHER PUBLICATIONS

Office Action for corresponding Chinese Patent Application No. 2017111226170, dated Jul. 11, 2019.
(Continued)

*Primary Examiner* — Reinaldo Sanchez-Medina
*Assistant Examiner* — Nicole Gardner
(74) *Attorney, Agent, or Firm* — Renner, Otto, Boisselle & Sklar, LLP

(57) ABSTRACT

A vacuum valve connected to a vacuum pump, comprises: a valve plate to be openably/closably driven; a drive section configured to openably/closably drive the valve plate; a signal input section to which a pump information signal indicating an operation state of the vacuum pump is input; and a valve control section configured to control operation of the valve plate based on the input pump information signal.

8 Claims, 11 Drawing Sheets

(51) Int. Cl.
*F16K 3/04* (2006.01)
*F04D 29/40* (2006.01)

(56) References Cited

U.S. PATENT DOCUMENTS

| 2012/0160344 | A1  | 6/2012 | Itafuji |
| 2015/0132969 | A1* | 5/2015 | Koiwa ............ H01L 21/67109 438/715 |

FOREIGN PATENT DOCUMENTS

| JP | 1996326952 A | 12/1996 |
| JP | 1998184586 A | 7/1998 |
| JP | 2002147386 A | 5/2002 |
| JP | 2003049771 A | 2/2003 |
| JP | 2003222096 A | 8/2003 |
| JP | 2007521438 A | 8/2007 |
| JP | 2010-135371 | 6/2010 |
| JP | 2011166101 A | 8/2011 |
| JP | 2016061283 A | 4/2016 |
| JP | 2010075008 A | 4/2019 |

OTHER PUBLICATIONS

Chinese Office Action for corresponding App. No. 201711122617.0, dated Feb. 12, 2019.
Office Action for corresponding Japan Patent Application No. 2017-003444, dated Mar. 6, 2020.

* cited by examiner

Fig. 10

| | VACUUM PUMP SIGNAL OUTPUT | | | | VALVE OPERATION | | | |
|---|---|---|---|---|---|---|---|---|
| | INSTANTANEOUS POWER FAILURE SIGNAL | BLACKOUT SIGNAL | INSTALLATION POSTURE | ROTATION SPEED EQUAL TO OR HIGHER THAN DEFINED ROTATION SPEED | AVAILABILITY OF REGENERATIVE POWER | DRIVE TORQUE | DRIVE SPEED | OPERATION MODE | OPERATION |
| S10 | OFF | OFF | H | ○ | AVAILABLE | HIGH | HIGH | NORMAL OPERATION | CONTINUE |
| S40 | ON | OFF | H | ○ | AVAILABLE | HIGH | MEDIUM | BLACKOUT STANDBY MODE | CONTINUE |
| S60 | ON | ON | H | ○ | AVAILABLE | HIGH | LOW | BLACKOUT MODE | DANGER AVOIDANCE |
| S80 | ON | ON | H | × | NOT AVAILABLE | LOW | STOP | BLACKOUT MODE | STOP |
| S10 | OFF | OFF | V | ○ | AVAILABLE | MEDIUM | HIGH | NORMAL OPERATION | CONTINUE |
| S40 | ON | OFF | V | ○ | AVAILABLE | MEDIUM | MEDIUM | BLACKOUT STANDBY MODE | CONTINUE |
| S60 | ON | ON | V | ○ | AVAILABLE | MEDIUM | LOW | BLACKOUT MODE | DANGER AVOIDANCE |
| S80 | ON | ON | V | × | NOT AVAILABLE | LOW | STOP | BLACKOUT MODE | STOP |

VACUUM VALVE, VACUUM PUMP, AND VACUUM PUMPING SYSTEM

BACKGROUND OF THE INVENTION

1. Technical Field

The present invention relates to a vacuum valve, a vacuum pump attached to the vacuum valve, and a vacuum pumping system including the vacuum valve and the vacuum pump.

2. Background Art

In a vacuum processing device (e.g., a film formation device or an etching device) for manufacturing a semiconductor, a flat panel display, a touchscreen, etc., film formation processing or etching processing is performed while the amount of process gas to be supplied is being controlled, for example. In such a vacuum processing device, a vacuum valve of which conductance is variable is provided between a process chamber and a vacuum pump. The conductance of the vacuum valve is adjusted for pressure adjustment of the process chamber.

In general, the vacuum valve of which conductance is variable changes the conductance thereof by a change in the degree of opening of a valve body (see, e.g., Patent Literature 1 (JP-A-2010-135371)). Moreover, the valve body can be fully closed, and can be used as in a gate valve by operation between a fully-closed state and a fully-open state.

In the case of emergency stoppage of the vacuum pump due to blackout etc., the vacuum valve needs to perform danger avoidance processing. For example, in the case of a process using inflammable gas, the vacuum valve is brought into the open state upon blackout, thereby preventing accumulation of the inflammable gas in the process chamber. In the case of a process using toxic gas, the vacuum valve is brought into the fully-closed state upon blackout, thereby closing the toxic gas in the process chamber to avoid danger. However, the typical vacuum valve cannot grasp the status of the vacuum pump, and for this reason, operation according to the status of the vacuum pump as described above cannot be performed.

SUMMARY OF THE INVENTION

A vacuum valve connected to a vacuum pump, comprises: a valve plate to be openably/closably driven; a drive section configured to openably/closably drive the valve plate; a signal input section to which a pump information signal indicating an operation state of the vacuum pump is input; and a valve control section configured to control operation of the valve plate based on the input pump information signal.

The pump information signal is at least one of a blackout signal indicating that a power supply to the vacuum pump is stopped, an instantaneous power failure signal output upon instantaneous power failure prior to blackout, rotor rotation speed information of the vacuum pump, or a posture information signal indicating an arrangement posture of the vacuum pump.

The pump information signal includes a blackout signal indicating that a power supply to the vacuum pump is stopped, and when the blackout signal is input to the signal input section, the valve plate is moved to a danger avoidance position set in advance.

The pump information signal further includes an instantaneous power failure signal output upon instantaneous power failure prior to blackout, and when the instantaneous power failure signal is input to the signal input section, the valve control section decreases an operation speed of the valve plate.

The pump information signal further includes a posture information signal indicating an arrangement posture of the vacuum pump, and the valve control section changes a drive torque of the valve plate according to the posture information signal.

The vacuum valve further comprises: a first power input section to which power is input from a commercial power supply; and a second power input section to which regenerative power generated at the vacuum pump is input during stoppage of the power supply. The pump information signal further includes rotor rotation speed information of the vacuum pump, and the valve control section stops movement to the danger avoidance position when a rotor rotation speed reaches equal to or lower than a predetermined rotation speed.

The vacuum valve further comprises: a first power input section to which power is input from a commercial power supply; and a second power input section to which regenerative power generated at the vacuum pump is input during stoppage of the power supply. When the blackout signal is input to the signal input section, the valve plate is, after the operation of the valve plate has been stopped for a predetermined time, moved to an initial position or the danger avoidance position set in advance.

A vacuum pump connected to the vacuum valve, comprises: a signal output section configured to output the pump information signal to the vacuum valve.

A vacuum pumping system comprises: the vacuum valve; a vacuum pump including a signal output section configured to output the pump information signal to the vacuum valve; a signal line connecting the signal output section of the vacuum pump and the signal input section of the vacuum valve; and a power line connecting a regenerative power output section of the vacuum pump and a second power input section of the vacuum valve.

According to the present invention, valve operation according to the status of the vacuum pump can be performed.

BRIEF DESCRIPTION OF THE DRAWINGS

FIG. 10 illustrates a valve operation state in each operation mode; and

DETAILED DESCRIPTION OF THE EXEMPLARY EMBODIMENTS

Hereinafter, embodiments of the present invention will be described with reference to the drawings.

First Embodiment

Figure 1:
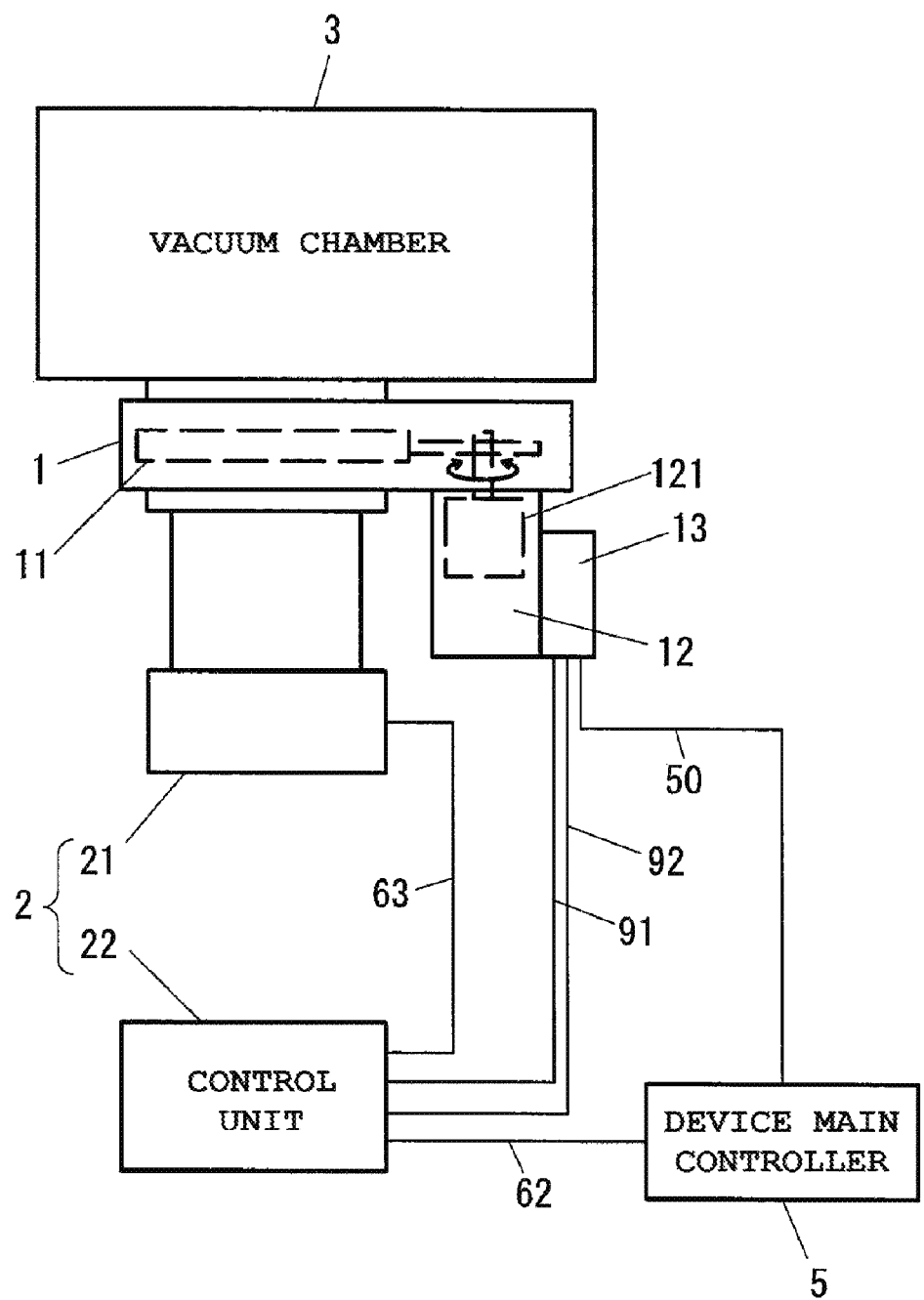
FIG. 1 is a view of a first embodiment of the present invention.

FIG. 1 is a view of an example of a vacuum pumping system including a vacuum valve according to the present invention. A vacuum chamber 3 is connected to a vacuum processing device. A vacuum pump 2 is attached to the vacuum chamber 3 through a vacuum valve 1. In general, a turbo-molecular pump is often used as the vacuum pump of the vacuum processing device. In the present embodiment, a case where a magnetic levitation type turbo-molecular pump using a magnetic bearing is used as the vacuum pump 2 will be described as an example.

The vacuum valve 1 is configured such that the valve conductance thereof changes by driving of a valve plate 11. The valve plate 11 is openably/closably driven by a valve body motor 121 provided at a valve drive section 12. The valve drive section 12 is controlled by a valve control section 13. The vacuum pump 2 includes a pump main body 21 configured to perform vacuum pumping, and a control unit 22 configured to control the pump main body 21.

The pump main body 21 and the control unit 22 are connected together through a cable 63. Note that an example of connection through the cable 63 will be described in this example, but a structure may be made such that the pump main body 21 and the control unit 22 are integrated together through internal wire connection. Moreover, the control unit 22 and the valve control section 13 of the vacuum valve 1 are connected together though cables 91, 92. The cable 91 is a communication cable for signal exchange between the valve control section 13 and the control unit 22. The cable 92 is provided for supplying the vacuum valve 1 with regenerative power generated at the vacuum pump 2. The control unit 22 and the valve control section 13 are, through cables 62, 50, connected to a vacuum-device-side main controller 5 as a higher-order controller. The vacuum pump 2 and the vacuum valve 1 are controlled by the vacuum-device-side main controller 5.

Figure 2:
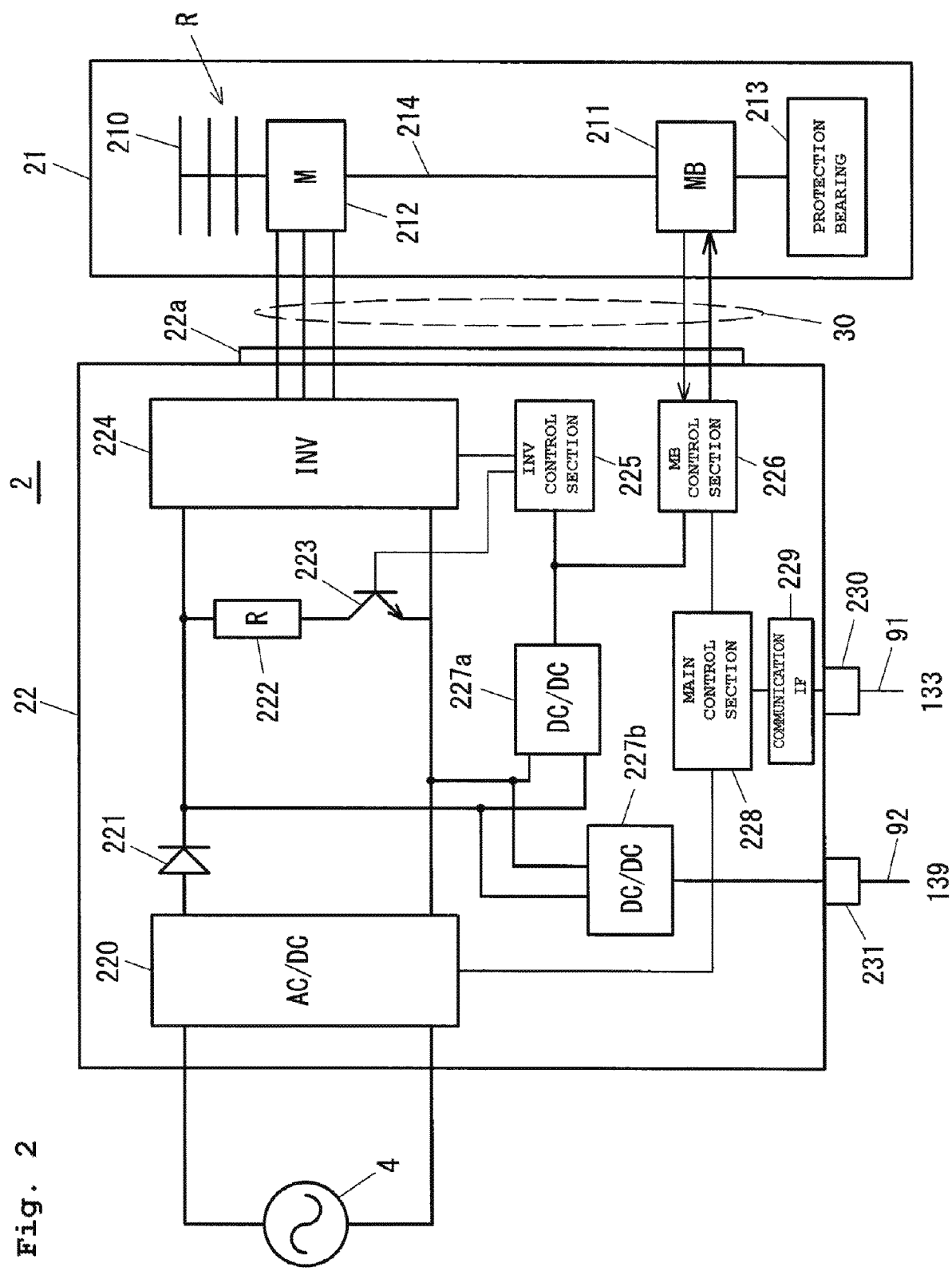
FIG. 2 is a block diagram of a schematic configuration of a vacuum pump.

FIG. 2 is a block diagram of a schematic configuration of the vacuum pump 2. The pump main body 21 includes, for example, stationary blades (not shown); a pump rotor 210 provided with rotor blades forming, together with the stationary blades, a turbo pump stage; a rotor shaft 214 fixed to the pump rotor 210; a motor 212 configured to rotatably drive, at high speed, a rotor body R having the pump rotor 210 and the rotor shaft 214; a magnetic bearing 211 configured to support the rotor shaft 214 in a non-contact state; and a protection bearing 213 configured to support the rotor shaft 214 in a non-energization state.

AC power is supplied from a commercial power source 4 to the control unit 22. The input AC power is subjected to power conversion into DC power by an AC/DC converter 220. A three-phase inverter 224 is connected to an output-side DC line of the AC/DC converter 220. The three-phase inverter 224 is configured to convert, into AC power, the DC power supplied from the AC/DC converter 220, thereby driving the motor 212. The three-phase inverter 224 is controlled by an inverter control section 225 such that AC power with a frequency necessary for rotation of the motor 212 is output.

A DC/DC converter 227a is configured to lower the voltage of the DC power from the DC line, thereby supplying such power to the inverter control section 225 and a magnetic bearing control section 226. The magnetic bearing control section 226 is configured to supply drive power to the magnetic bearing 211 provided at the pump main body 21. The magnetic bearing 211 is provided with a displacement sensor (not shown) configured to detect displacement of the rotor shaft 214. The magnetic bearing control section 226 is configured to control the drive power for the magnetic bearing 211 based on detection information of the displacement sensor such that the rotor shaft 214 is supported at a desired position in the non-contact state. The three-phase inverter 224 and the magnetic bearing control section 226 are connected to the motor 212 and the magnetic bearing 211 through an interface panel 22a.

For stopping the pump main body 21, regenerative control of the three-phase inverter 224 is performed such that rotation of the rotor shaft 214 is immediately stopped, and rotation of the rotor shaft 214 is decelerated by a regenerative brake. Thus, a series circuit of a brake resistor 222 and a switch element (a transistor) 223 is, on the DC line, provided in parallel with the three-phase inverter 224. ON/OFF of the switch element 223 is controlled by the inverter control section 225. Upon regenerative braking, the switch element 223 is turned ON, and the regenerative power is consumed by the brake resistor 222. A diode 221 for regenerative power backflow prevention is provided on the DC line.

In the case of stopping a power supply from the commercial power source 4 due to blackout etc., magnetic levitation of the rotor shaft 214 is maintained by the above-described regenerative power such that magnetic levitation is not stopped in response to stoppage of the power supply. That is, upon blackout, the regenerative power is input to the DC/DC converter 227a, and the inverter control section 225 and the magnetic bearing control section 226 are operated by the regenerative power. Note that when the regenerative power is supplied to the inverter control section 225 and the magnetic bearing control section 226, the switch element 223 for operating the regenerative brake is turned OFF.

Stoppage of the power supply is detected by the AC/DC converter 220, and such blackout information is input to a main control section 228 of the control unit 22. When receiving the blackout information, the main control section 228 controls the magnetic bearing control section 226 to perform magnetic levitation by means of the regenerative power. Moreover, the main control section 228 outputs an instantaneous power failure signal, a blackout signal, rotor rotation speed information, etc. to the outside through a communication interface 229 and a communication terminal 230. The cable 91 is connected to the communication terminal 230, and the instantaneous power failure signal, the blackout signal, the rotor rotation speed information, etc. are input to the valve control section 13 of the vacuum valve 1 through the cable 91.

Note that a signal indicating a rotation speed itself or a signal indicating a rotation speed equal to or lower than a predetermined rotation speed may be used as the rotor rotation speed information. The predetermined rotation speed described herein is a threshold indicating whether or not the regenerative power can be stably supplied to a vacuum valve side. In a case where the rotor rotation speed is equal to or lower than the predetermined rotation speed, driving of the vacuum valve 1 by the regenerative power becomes unstable, and therefore, later-described operation is performed by the vacuum valve 1. The rotor rotation speed information will be described below as the signal indicating the rotation speed itself.

In this example, even in the case of a lack of a single cycle of AC input to the AC/DC converter 220, i.e., upon instantaneous power failure, the instantaneous power failure signal is output. For example, in a case where an AC input frequency is 50 Hz, the instantaneous power failure signal is output when no input is made for 20 msec or longer. In the case of 60 Hz, the instantaneous power failure signal is output when no input is made for 17 msec or longer. Moreover, the blackout signal is output when instantaneous power failure continuously occurs for a certain set time (e.g., one second). For example, in a case where the set time is one second and instantaneous power failure is continued only for 0.9 seconds, such a state is not taken as blackout, and the blackout signal is not output. That is, in a case where instantaneous power failure is continued for one second, the instantaneous power failure signal is output every 20 msec (in the case of 60 Hz), and the blackout signal is output after instantaneous power failure has been continued for one second.

The control unit 22 further includes a DC/DC converter 227b for supplying the regenerative power to an external device (in the present embodiment, the vacuum valve 1). In general, the voltage of the regenerative power is different from a supply voltage required for the vacuum valve 1 side. For example, the voltage of the regenerative power is DC 120 V, and the voltage on the vacuum valve 1 side is DC 24 V. Thus, the voltage of the regenerative power is, using the DC/DC converter 227b, converted into the voltage required for the vacuum valve 1 side. The regenerative power output from the DC/DC converter 227b is output from a regenerative power output terminal 231 provided at the control unit 22. The cable 92 illustrated in FIG. 1 is connected to the regenerative power output terminal 231.

Figure 3:
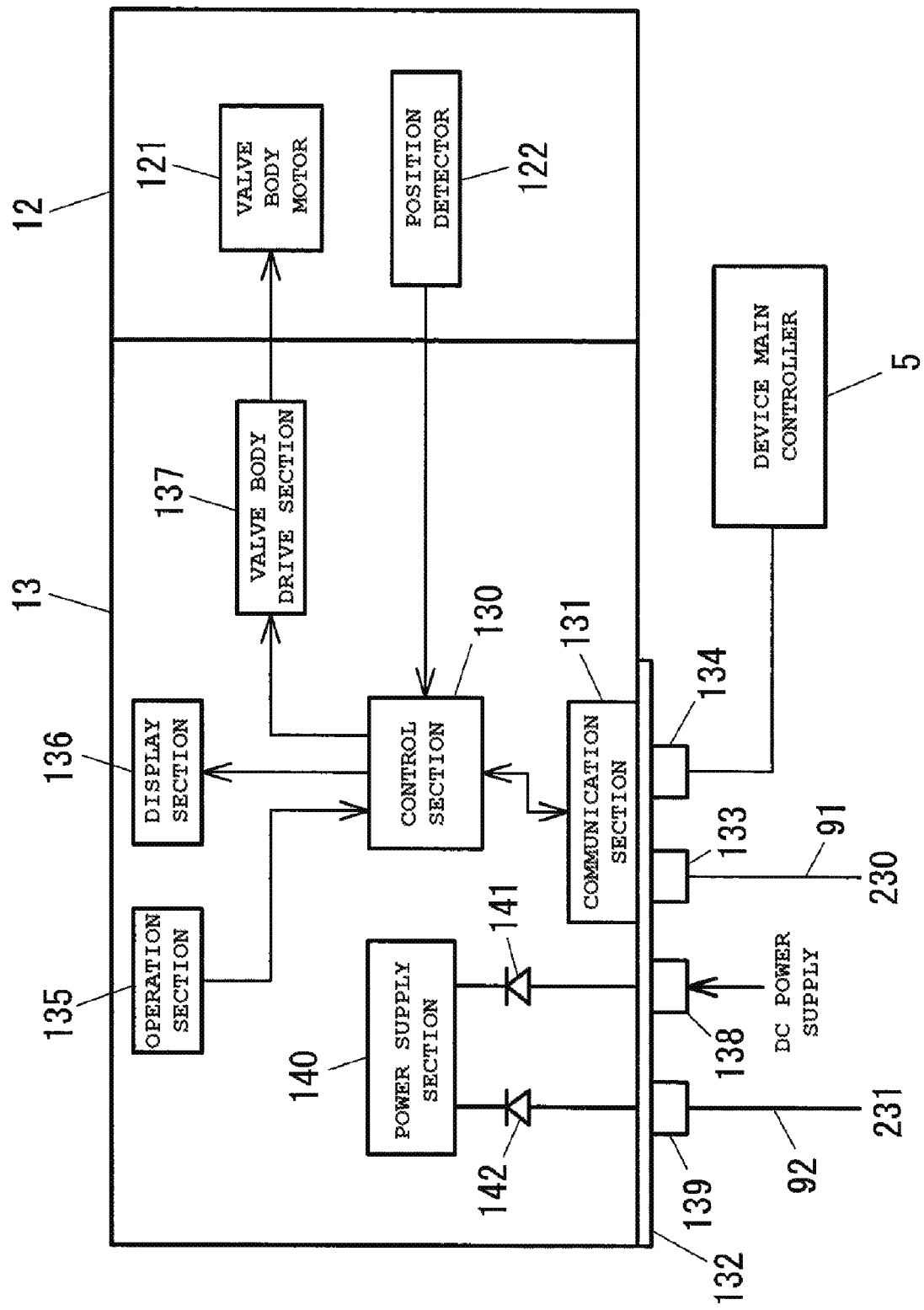
FIG. 3 is a block diagram of a valve drive section and a valve control section in a vacuum valve.

FIG. 3 is a block diagram of the valve drive section 12 and the valve control section 13 in the vacuum valve 1. The valve drive section 12 is provided with the valve body motor 121 for openably/closably driving the valve plate 11 (see FIG. 1). The drive position of the valve plate 11 is detected by a position detector 122. For example, an encoder configured to detect the amount of rotation of the valve body motor 121 is used as the position detector 122. The position of the valve plate 11 can be obtained from the amount of rotation of the valve body motor 121.

A drive command is, through a communication section 131, input from the vacuum-device-side main controller 5 to a control section 130 provided at the valve control section 13. In an example illustrated in FIG. 3, a remote operation signal is input from the main controller 5 to a remote terminal 134 provided at an interface panel 132. Moreover, an operation section 135 provided at the valve control section 13 is manually operated so that the drive command can be input to the control section 130. The control section 130 outputs, to a valve body drive section 137, a control signal based on the input drive command. The valve body drive section 137 drives the valve body motor 121 based on the control signal from the control section 130. A vacuum valve state, setting, etc. are displayed on a display section 136.

The interface panel 132 of the valve control section 13 is provided with terminals 138, 139 for supplying DC power to the valve control section 13. A DC power source is connected to the terminal 138. For example, DC power subjected to AC/DC conversion of commercial power source in the vacuum processing device is used for the DC power source. On the other hand, the regenerative power output terminal 231 of the control unit 22 is connected to the terminal 139 through the cable 92. That is, the regenerative power is supplied from the control unit 22 to the terminal 139.

The DC power input through the terminal 138 is input to a power supply section 140 through a diode 141 for backflow prevention. The regenerative power input through the terminal 139 is input to the power supply section 140 through a diode 142 for backflow prevention. The power supply section 140 supplies the power to each of the valve control section 13 and the valve drive section 12. In a normal state, the power from the DC power source is supplied to the terminal 138, and the diode 142 prevents the current from the DC power source from flowing back to the terminal 139. Upon blackout, the regenerative power is supplied to the terminal 139, and the diode 141 prevents the current of the regenerative power from flowing back to the terminal 138.

Further, the interface panel 132 is provided with a communication terminal 133, the communication terminal 133 being connected to the communication terminal 230 of the control unit 22 through the cable 91. The valve control section 13 performs valve operation based on vacuum-pump-side information input through the communication terminal 230. The vacuum-pump-side information includes, for example, the above-described instantaneous power failure signal, the above-described blackout signal, the above-described rotor rotation speed information, and information (hereinafter referred to as "posture information") on a pump attachment posture. A pump information signal input to the communication terminal 133 is input to the control section 130 through the communication section 131.

The control section 130 causes the vacuum valve 1 to perform the following operation according to the pump information signal input from the control unit 22. Operation in the case of receiving the instantaneous power failure signal, the blackout signal, and the rotor rotation speed information and operation in the case of receiving the posture information will be described below.

(Valve Operation Upon Reception of Instantaneous Power Failure Signal, Blackout Signal, and Rotor Rotation Speed Information)

Figure 4:
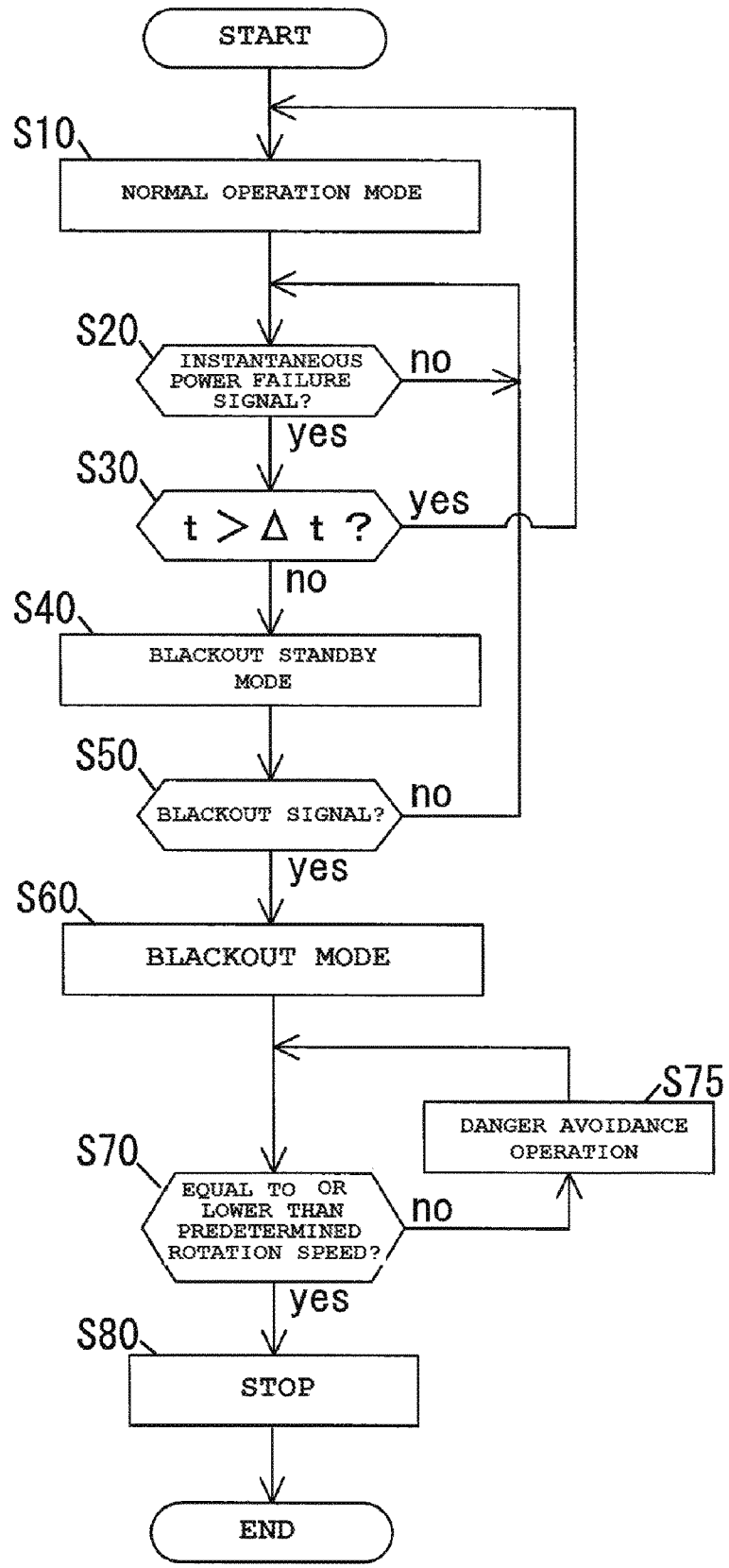
FIG. 4 is a flowchart of an example of processing in a blackout mode etc.

When receiving the instantaneous power failure signal and the blackout signal through the communication terminal 133, the control section 130 of the valve control section 13 causes the vacuum valve 1 to perform operation as shown in FIG. 4. FIG. 4 shows an example of processing in a case where the control section 130 receives the instantaneous power failure signal, the blackout signal, etc. from the control unit 22. Upon start up, the control section 130 sets an operation mode to a normal operation mode at a step S10.

At a step S20, it is determined whether or not the instantaneous power failure signal has been received. When the instantaneous power failure signal is received, the processing proceeds to a step S30. At the step S30, it is determined whether or not a signal non-reception period t after reception of the instantaneous power failure signal until subsequent reception of the instantaneous power failure signal exceeds a predetermined time Δt. That is, in a case (t>Δt) where instantaneous power failure is caused in a single moment of time, but does not lead to blackout, the processing proceeds to the step S10 to return the operation mode from a blackout standby mode to the normal operation mode. A determination condition Δt in this case is set to, e.g., about one second (about an instantaneous power failure duration when the blackout signal is output).

On the other hand, when it is, at the step S30, determined that t>Δt is not satisfied, the processing proceeds to a step S40 to set the operation mode to the blackout standby mode. In the blackout standby mode, the earlier valve operation is continued, but the operation speed of the valve plate 11 is decreased as compared to that in the normal operation mode. The operation speed is decreased in the blackout standby mode as described above, leading to smooth transition to subsequent danger avoidance operation.

At a step S50, it is determined whether or not the blackout signal has been received. When it is, at the step S50, determined that the blackout signal has not been received, the processing returns to the step S20 to continue the blackout standby mode. On the other hand, when it is, at the step S50, determined that the blackout signal has been received, the processing proceeds to a step S60 to set the operation mode to a blackout mode. In the blackout mode, the operation speed of the valve plate 11 is further decreased as compared to that in the blackout standby mode.

At a step S70, it is, based on the rotor rotation speed information received from the control unit 22, determined whether or not the rotor rotation speed is equal to or lower than the predetermined rotation speed. When it is, at the step S70, determined that the rotor rotation speed is not equal to or lower than the predetermined rotation speed, the processing proceeds to a step S75 to perform the danger avoidance operation. In the case of a process using inflammable gas, the danger avoidance operation is, for example, performed such that the vacuum valve 1 is brought into an open state upon blackout to prevent a gas pressure from increasing due to accumulation of the inflammable gas in the vacuum chamber 3. In the case of a process using toxic gas, the vacuum valve 1 is brought into a fully-closed state upon blackout such that the toxic gas is held in the vacuum chamber 3.

On the other hand, when it is, at the step S70, determined that the rotor rotation speed is equal to or lower than the predetermined rotation speed, the processing proceeds to a step S80 to stop operation of the vacuum valve 1 for placing a priority on normal operation (processing operation upon blackout) of the vacuum pump 2. For example, when the valve plate 11 is being in drive operation, such driving is stopped. The predetermined rotation speed described herein is a rotation speed at which magnetic levitation control of the vacuum pump 2 and the valve operation of the vacuum valve 1 can be simultaneously performed when the rotor rotation speed exceeds the predetermined rotation speed.

As described above, the danger avoidance operation is performed after the blackout mode has been set until the rotor rotation speed reaches equal to or lower than the predetermined rotation speed. In general, a time required for the danger avoidance operation is shorter than a time until the rotor rotation speed reaches equal to or lower than the predetermined rotation speed, and therefore, the danger avoidance operation is completed upon transition to stop operation of the step S80. For example, in a case where the predetermined rotation speed is set to 50% of a rated rotation speed and the turbo-molecular pump has a medium to large size, it takes at least about 10 minutes to decrease to the predetermined rotation speed. That is, a sufficient time for completion of the danger avoidance operation can be ensured. Note that a deceleration time is shortened in the case of performing gas purging during stoppage of the pump. Even in this case, a priority is placed on the magnetic levitation operation during stoppage of the pump because of the step S80.

In the present embodiment, the vacuum valve 1 is, upon blackout, driven by the regenerative power supplied from the turbo-molecular pump. In the turbo-molecular pump, when blackout is detected by the AC/DC converter 220 of the control unit 22, the three-phase inverter 224 is subjected to regenerative operation. Then, the magnetic bearing 211 is driven by the regenerative power so that magnetic levitation can be maintained and pump stop operation can be safely performed even in the case of blackout.

(Another Example of Valve Operation)

Figure 11:
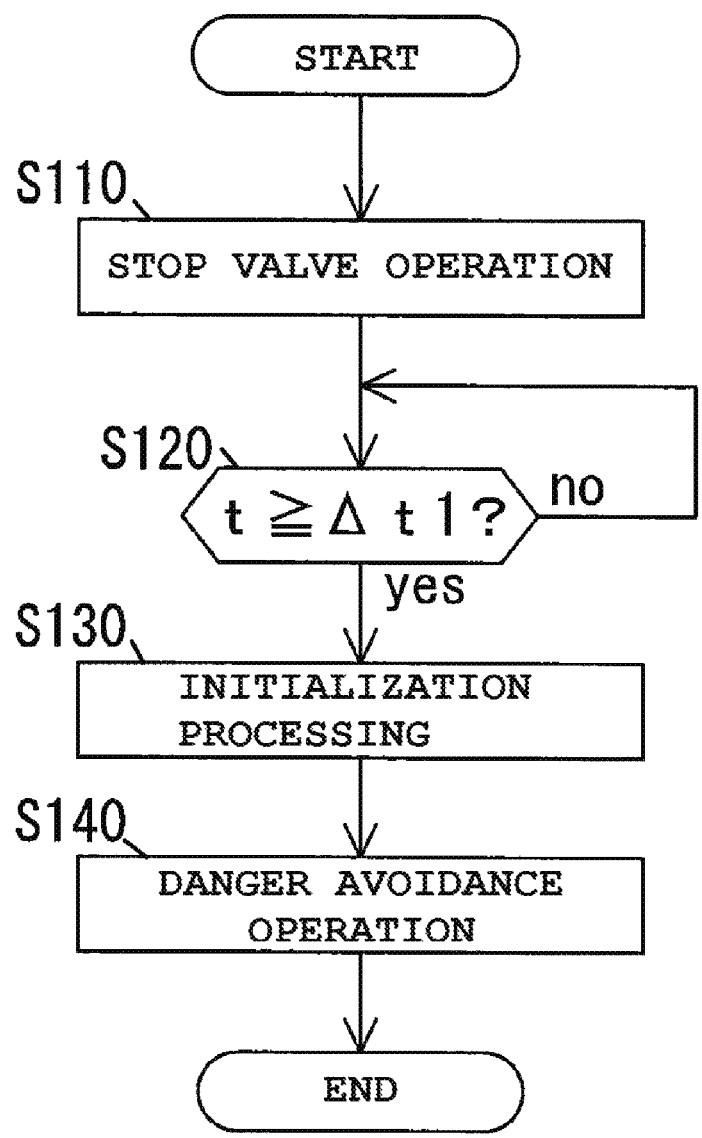
FIG. 11 is a flowchart of another example of valve operation.

FIG. 11 is a flowchart of another example of the valve operation. In this example, the valve operation as shown in FIG. 11 is performed based on the received blackout signal. Processing shown in FIG. 11 starts when a blackout detection signal is detected. At a step S110, the earlier valve operation is stopped. For example, when the valve plate 11 is being in the drive operation, such drive operation is stopped.

At a S120, it is determined whether or not a predetermined time Δt1 has been elapsed after reception of the blackout detection signal. When it is, at the step S120, determined that the predetermined time has been elapsed, the processing proceeds to a step S130 to perform initialization processing. The initialization processing indicates a series of processing of moving the valve plate 11 to a predetermined initial position (a reference position in valve opening/closing).

At a step S140, the danger avoidance operation for holding the vacuum device in a safe state is performed. For example, in the case of the process using the inflammable gas, the vacuum valve 1 is brought into the open state upon blackout to prevent the gas pressure from increasing due to accumulation of the inflammable gas in the vacuum chamber 3. In the case of the process using the toxic gas, the vacuum valve 1 is brought into the fully-closed state upon blackout such that the toxic gas is held in the vacuum chamber 3.

In this example, the processing holds, at the step S120, for the predetermined time Δt1 because of the following reason. In normal stop operation of the vacuum valve 1, when a stop signal is input through the remote terminal 134, the earlier valve operation is stopped, and the valve plate is moved to the initial position. For example, when the valve plate 11 is being in the drive operation, such driving is stopped, and the valve plate 11 is moved to the initial position. Note that as in the valve operation shown in FIG. 4, the operation of the vacuum valve 1 may be stopped when the rotor rotation speed reaches equal to or lower than the predetermined rotation speed.

The vacuum valve 1 is, upon blackout, driven by the regenerative power supplied from the turbo-molecular pump. In the turbo-molecular pump, when blackout is detected by the AC/DC converter 220 of the control unit 22, the three-phase inverter 224 is subjected to the regenerative operation. Then, the magnetic bearing 211 is driven by the regenerative power so that magnetic levitation can be maintained and the pump stop operation can be safely performed even in the case of blackout.

As described above, part of the regenerative power is also supplied to the vacuum valve 1 through the DC/DC converter 227b and the regenerative power output terminal 231. It takes about hundreds of μsec after blackout has been detected by the AC/DC converter 220 until the regenerative operation begins. Thus, delay operation of the vacuum valve 1 is preferably performed to avoid adverse influence on magnetic levitation. In the present embodiment, the delay time Δt1 is provided as in the step S120. Considering the above-described regenerative operation, the delay time Δt1 is preferably set to about 1 sec.

(Operation upon Reception of Posture Information)

Next, the operation upon reception of the posture information will be described. First, the posture information input from the control unit 22 to the valve control section 13 of the vacuum valve 1 will be described. The posture information described herein indicates the attachment posture of the pump main body 21 on the vacuum chamber 3, and a posture in which an axial direction of the rotor shaft is in the vertical direction as illustrated in FIG. 1 will be referred to as a "standing posture." In this state, the posture of the vacuum valve 1 attached to a suction port flange of the pump main body 21 is a posture in which the valve plate 11 is swingably driven in the horizontal plane.

Figure 5:
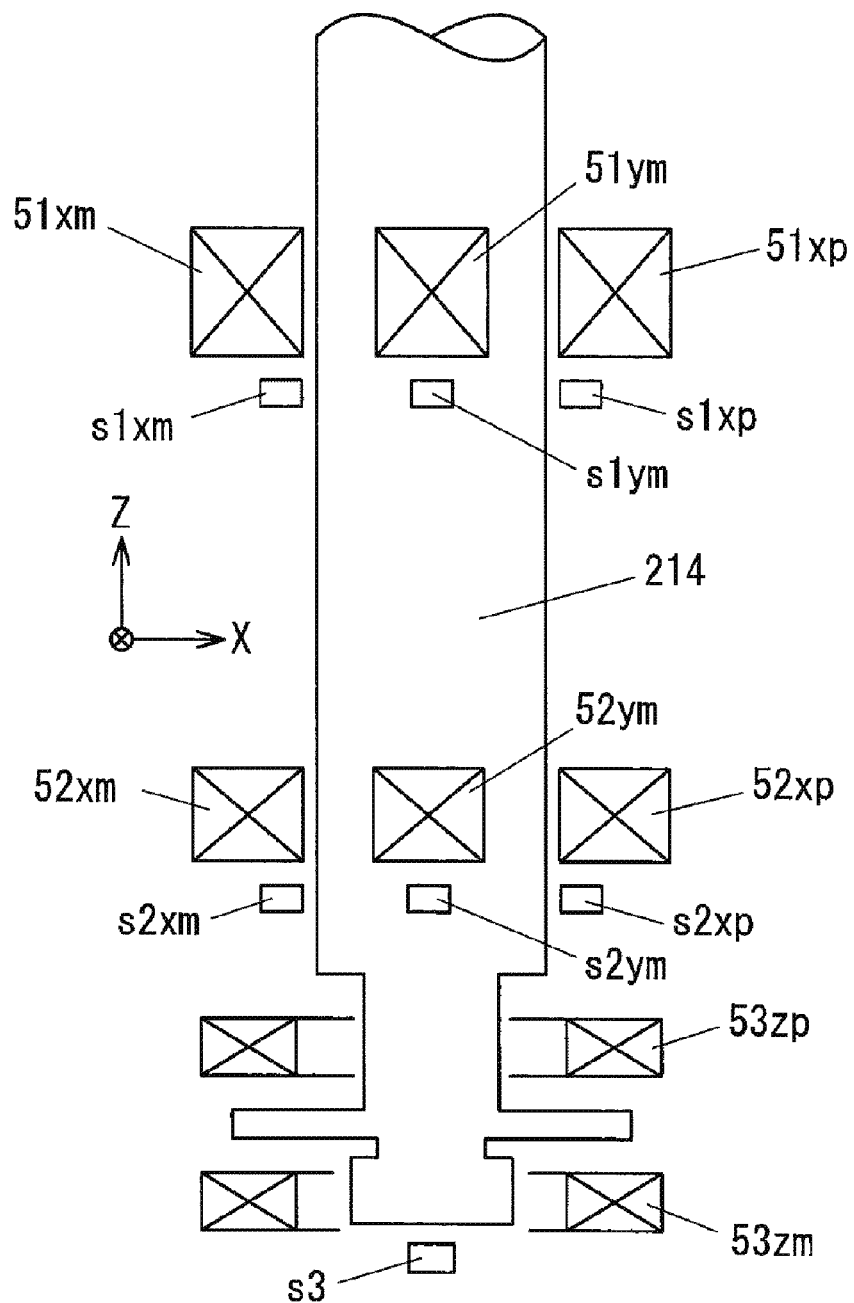
FIG. 5 is a view for describing a five-axis control type magnetic bearing.

In the present embodiment, the vacuum pump 2 is the magnetic levitation type turbo-molecular pump. As illustrated in FIG. 5, the rotor shaft 214 to which the pump rotor 210 is fixed is supported by the magnetic bearing in the non-contact state.

The magnetic bearing illustrated in FIG. 5 is a schematically-illustrated five-axis control type magnetic bearing, and the rotor shaft 214 is magnetically supported by five pairs of electromagnets. These five pairs of electromagnets form an upper radial magnetic bearing (two axes), a lower radial magnetic bearing (two axes), and an axial magnetic bearing (one axis). The upper radial magnetic bearing includes a single pair of electromagnets $51xp$, $51xm$ for an X-axis direction, and a single pair of electromagnets $51yp$, $51ym$ for a Y-axis direction. Similarly, the lower radial magnetic bearing includes a single pair of electromagnets $52xp$, $52xm$ for the X-axis direction, and a single pair of electromagnets $52yp$, $52ym$ for the Y-axis direction. Each of the electromagnets $51xp$, $51xm$, $51yp$, $51ym$, $52xp$, $52xm$, $52yp$, $52ym$ is provided with a displacement sensor $s1xp$, $s1xm$, $s1yp$, $s1ym$, $s2xp$, $s2xm$, $s2yp$, $s2ym$. Moreover, the axial magnetic bearing includes a single pair of electromagnets $53zp$, $53zm$ arranged in a z-axis direction, and a displacement sensor $s3z$. Note that the electromagnets $51yp$, $52yp$ and the displacement sensors $s1yp$, $s2yp$ are provided on the opposite side of the plane of paper from the rotor shaft 214, and therefore, are out of view behind the rotor shaft 214 in FIG. 5.

In the magnetic bearings illustrated in FIG. 5, the displacement sensors are used to detect displacement of the rotor shaft 214 from a predetermined levitation position, and each electromagnet current is controlled such that the levitation position of the rotor shaft 214 reaches the predetermined levitation position. In a case where the direction of the rotor shaft is in the vertical direction, i.e., a case where the pump posture is the standing posture or an inverted standing posture, a current value of the electromagnet $53zp$ and a current value of the electromagnet $53zm$ are different from each other. For example, in the standing posture, in the case of sucking the rotor shaft 214 by the electromagnets, suction force of the electromagnet $53zp$ is stronger than suction force of the electromagnet $53zm$ by the force of gravity. Conversely, in the inverted standing posture, the suction force of the electromagnet $53zm$ is stronger than the suction force of the electromagnet $53zp$ by the force of gravity. Moreover, in the case of the horizontal posture, the suction force is equal between the electromagnet $53zp$ and the electromagnet $53zm$ because no influence due to the force of gravity is provided. As described above, the current values of the electromagnets $53zp$, $53zm$ are detected so that it can be determined whether the pump posture is the standing posture, the inverted standing posture, or the horizontal posture.

Figure 6:
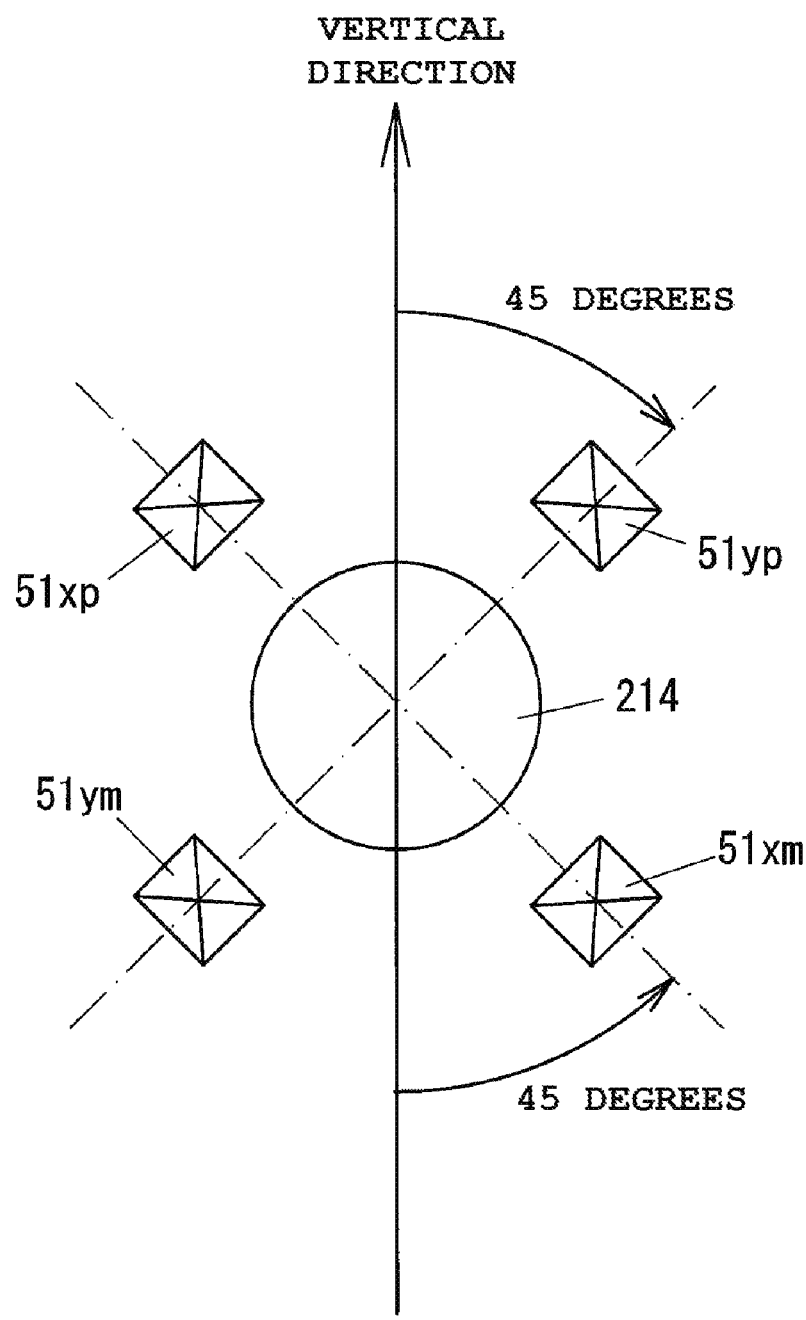
FIG. 6 is a view of arrangement of electromagnets of a radial magnetic bearing in a case where the vacuum pump is in a horizontal posture.

Further, in a case where the vacuum pump 2 is placed transversely such that the rotor shaft 214 is in the horizontal direction, the posture is made such that the radial electromagnets are arranged as illustrated in FIG. 6, for example. FIG. 6 is a view of arrangement of the electromagnets $51xp$, $51xm$, $51yp$, $51ym$ of the upper radial magnetic bearing. That is, the posture is made such that one (the electromagnets $51xp$, $51yp$) of the pairs of electromagnets $51xp$, $51xm$, $51yp$, $51ym$ provided in the X-axis direction and the Y-axis direction is disposed at an angle of 45 degrees diagonally from a vertically upward direction and the other one (the electromagnets $51xm$, $51ym$) of the pairs of electromagnets is disposed at an angle of 45 degrees diagonally from a vertically downward direction. In this case, suction force of the electromagnets $51xp$, $51yp$ is greater than suction force of the electromagnets $51xm$, $51ym$. That is, a current value of the electromagnet $51xp$, $51yp$ is greater than a current value of the electromagnet $51xm$, $51ym$, and therefore, it is recognized which surface of the vacuum pump 2 faces upward in horizontal arrangement.

The above-described posture information on the attachment posture of the vacuum pump 2 is input from the main control section 228 to the valve control section 13 of the vacuum valve 1 through the cable 91. On the vacuum valve 1 side, drive control of the valve body motor 121, i.e., drive control of the valve plate 11, is changed according to the input posture information.

Figure 7:
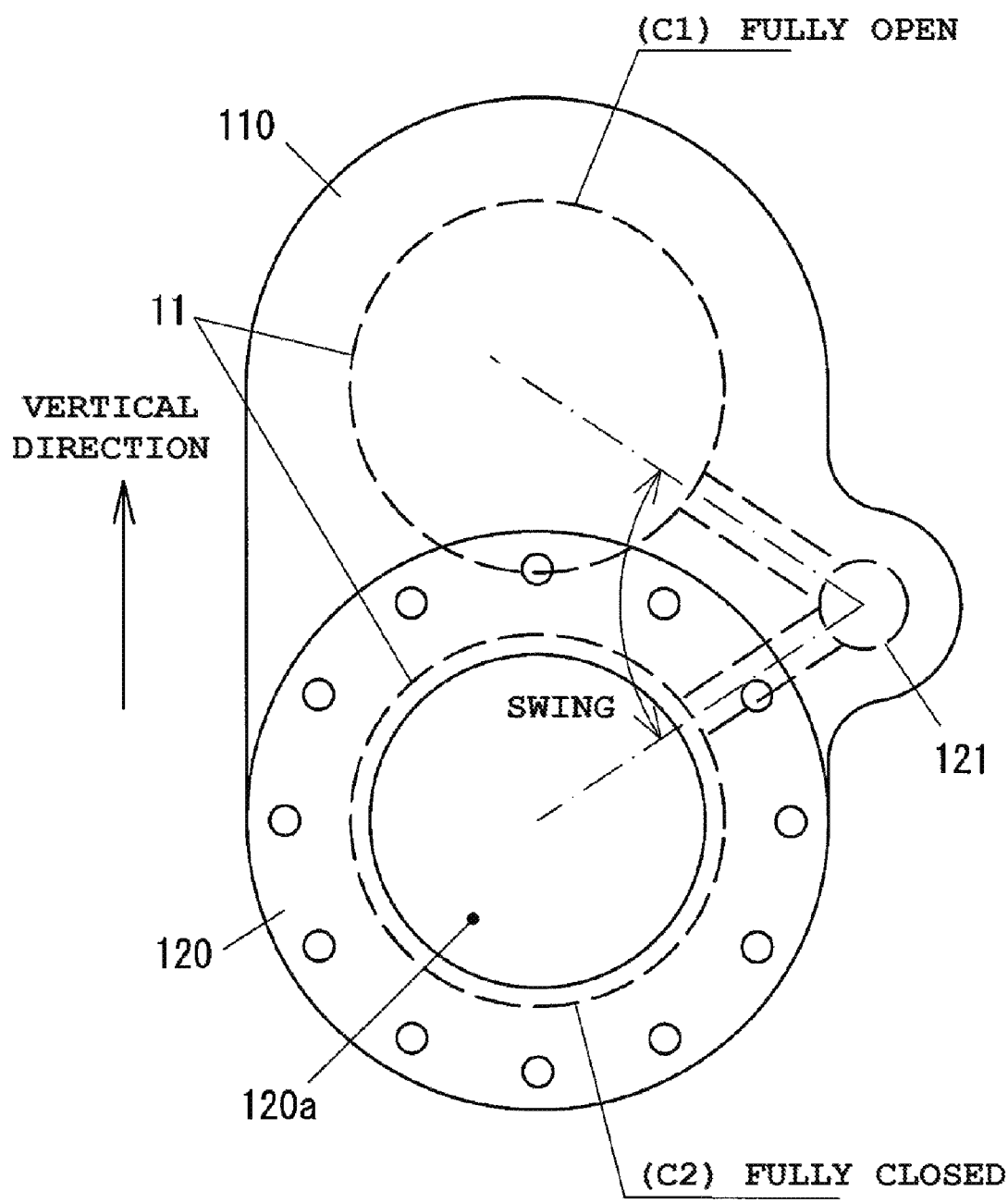
FIG. 7 is a view for describing opening/closing of the vacuum valve.

FIG. 7 is a view for describing opening/closing of the vacuum valve 1, the view being a plan view from a vacuum pump side. The valve plate 11 provided in a housing 110 is swingably driven by the valve body motor 121. Each of a front side (a suction side) and a back side (an exhaust side) of the housing 110 is provided with a flange. FIG. 7 is a view of the housing 110 from the exhaust side (the vacuum pump 2 side), and a flange 120 to which the vacuum pump 2 is fixed is formed. The valve plate 11 is swingably movable to an optional position between a fully-closed position C2 at which the entirety of a valve opening 120a is closed and a fully-open position C1 at which the valve plate 11 does not face the valve opening 120a at all.

FIG. 7 illustrates an example of the posture of the vacuum valve 1 in a case where the vacuum pump 2 is in the horizontal posture as illustrated in FIG. 6. In this state, a surface of the flange 120 is coincident with the vertical plane. Normally, in a case where the vacuum pump 2 is in the standing posture as illustrated in FIG. 2, the valve plate 11 is driven in the horizontal plane, and therefore, a drive torque is the substantially same between the case of driving in an opening direction and the case of driving in a closing direction. In the case of closably driving the valve plate 11 in the posture illustrated in FIG. 7, a drive direction is substantially coincident with the direction of the force of gravity, and therefore, driving can be made with a smaller torque than that in the case of driving in the horizontal state. Conversely, in the case of openably driving the valve plate 11, the valve plate 11 is driven against the force of gravity, and therefore, a greater drive torque than that in the case of driving in the horizontal state is necessary.

For this reason, in the present embodiment, the control section 130 determines the posture of the vacuum valve 1 from the input posture information, and changes the drive control of the valve plate 11 according to the determined posture. For example, in a case where it is determined as being in the posture state illustrated in FIG. 7, the drive torque is, in closable driving, decreased as compared to that in the horizontal state, and therefore, driving is made with less power consumption at the substantially same speed as that in the case of the horizontal state. Conversely, the drive torque is, in openable driving, increased as compared to that in the case of the horizontal state, and therefore, a driving speed is the substantially same speed as that in the case of the horizontal state. Such drive control allows the substantially same opening/closing operation regardless of the attachment posture of the vacuum valve 1.

Note that the posture information input from the control unit 22 of the vacuum pump 2 includes not only the standing posture, the inverted standing posture, and the horizontal posture, but also phase information in the case of the horizontal posture. The phase information described herein is angle information upon clockwise rotation from the state of FIG. 6, assuming that the posture illustrated in FIG. 6 satisfies Phase=0. Such angle information can be also determined with reference to the current values of the electromagnets 51$xp$, 51$xm$, 51$yp$, 51$ym$.

FIG. 10 is a table collectively showing valve operation states in each operation mode illustrated in FIG. 4. An installation posture indicates the posture of the vacuum pump 2 (the pump main body 21) attached to the vacuum valve 1, and a reference character "H" indicates a case where the pump shaft is attached horizontally. A reference character "V" indicates a case where the pump shaft is vertically attached to the device as in FIG. 1. A drive torque indicates the magnitude of a motor drive current for openably/closably driving the valve plate 11. As described above, the drive torque in the normal operation needs a greater torque in the case of the horizontal posture than in the case of the vertical posture. Moreover, the drive torque in the stop operation indicates a stop torque necessary for holding the valve plate 11 at a stop position.

Second Embodiment

Figure 8:
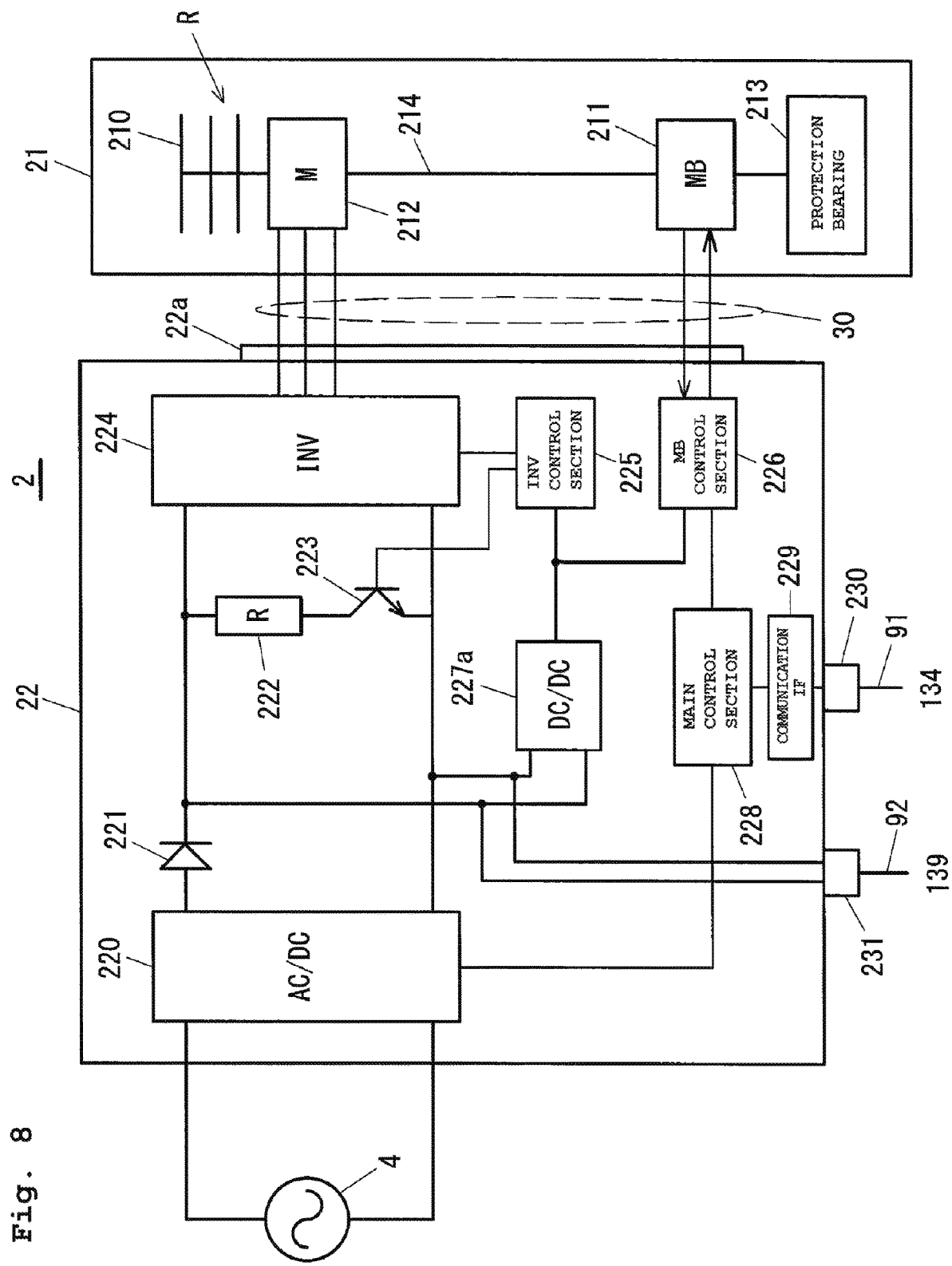
FIG. 8 is a block diagram of a schematic configuration of a vacuum pump of a second embodiment.

A second embodiment of the present invention will be described with reference to FIGS. 8 and 9. FIG. 8 is a block diagram of a schematic configuration of a vacuum pump 2 in the second embodiment, and corresponds to FIG. 2 of the first embodiment.

The vacuum pump 2 illustrated in FIG. 8 is different from the vacuum pump illustrated in FIG. 2 in that a control unit 22 does not include a DC/DC converter 227$b$. Other configurations are exactly similar to those in the case of FIG. 2, and the same reference numerals are used. That is, in the second embodiment, it is configured such that regenerative power output from a three-phase inverter 224 is output from a regenerative power output terminal 231 without being lowered by the DC/DC converter.

Figure 9:
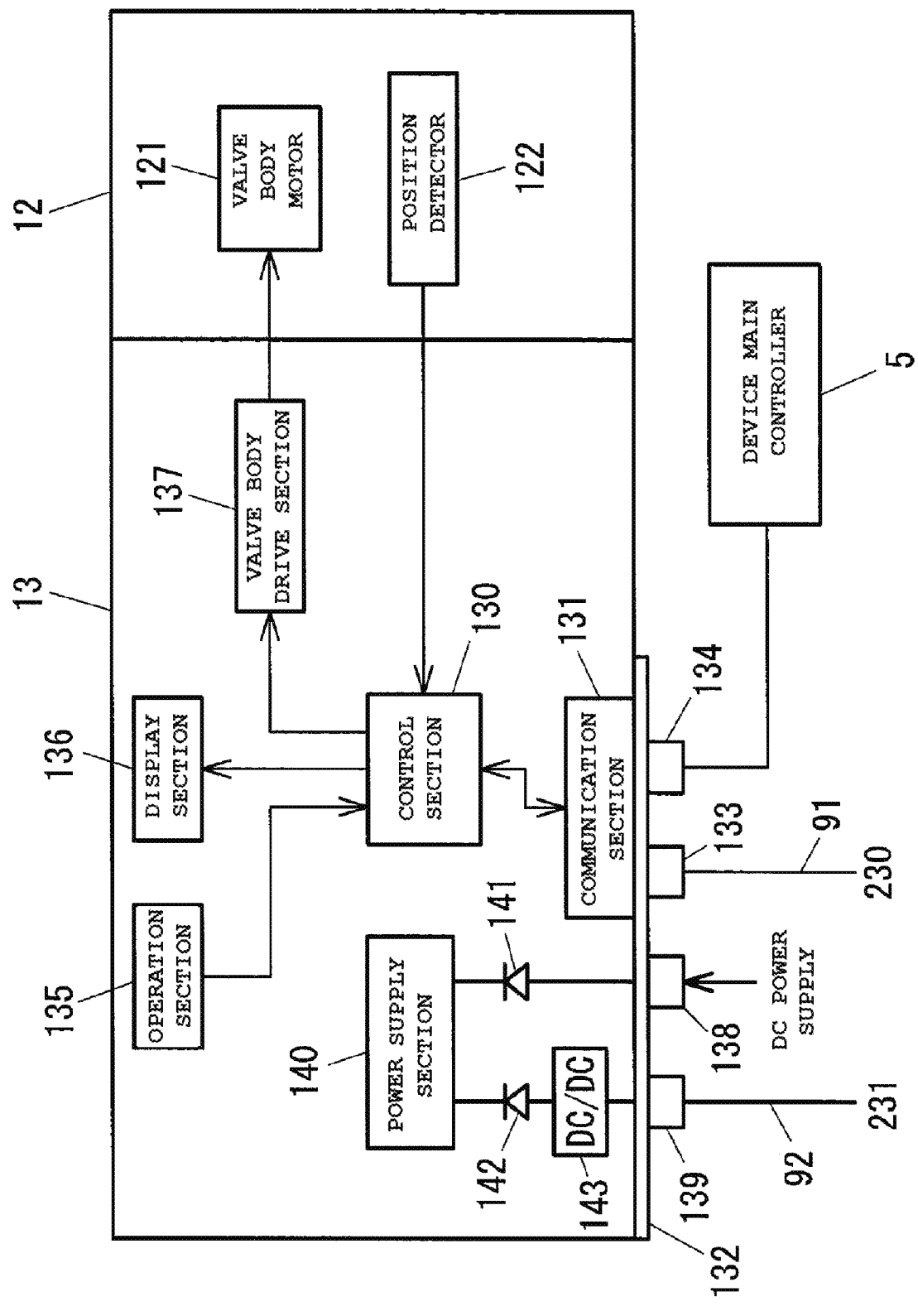
FIG. 9 is a block diagram of schematic configurations of a valve drive section and a valve control section in the second embodiment.

FIG. 9 is a block diagram of schematic configurations of a valve drive section 12 and a valve control section 13 in the second embodiment, and corresponds to FIG. 3 of the first embodiment. A difference of the configuration of FIG. 9 from the configuration of FIG. 3 is that a DC/DC converter 143 is further provided. Other configurations are similar to those in the case of FIG. 3. The DC/DC converter 143 is disposed on a regenerative power line between a terminal 139 and a diode 142.

As illustrated in FIG. 8, the regenerative power output from the three-phase inverter 224 is output from the regenerative power output terminal 231 without the DC/DC converter, and then, is input to the terminal 139 of the valve control section 13 through a cable 92. Thus, in the second embodiment, the DC/DC converter 143 is provided at the valve control section 13, thereby converting the voltage of the regenerative power into a supply voltage required for a vacuum valve side.

In the second embodiment, similar features and advantageous effects to those of the above-described first embodiment are provided. Further, in the second embodiment, the DC/DC converter 143 configured to convert the voltage of the regenerative power into input voltage of a power supply section 140 is provided on the vacuum valve 1 side as illustrated in FIG. 9. With this configuration, the vacuum pump 2 is applicable to a plurality of vacuum valves 1 with different input voltages.

In the above-described embodiments, the following features and advantageous effects are provided.

(1) The vacuum valve 1 connected to the vacuum pump 2 includes the valve plate 11 to be openably/closably driven, the valve drive section 12 configured to openably/closably drive the valve plate 11, the communication terminal 133 as a signal input section to which the pump information signal indicating the operation state of the vacuum pump 2 is input, and the valve control section 13 configured to control operation of the valve plate 11 based on the input pump information signal. As a result, the vacuum valve 1 can perform proper valve operation according to the state of the vacuum pump 2. For example, the pump information signal includes the blackout information indicating that the commercial power source is stopped, the posture information on the vacuum pump 2 when the vacuum valve 1 attached to the vacuum pump 2 is attached to the vacuum device, and the operation state of the vacuum pump 2.

(2) The pump information signal is, for example, at least one of the blackout signal indicating that the power supply to the vacuum pump 2 is stopped, the instantaneous power failure signal output upon instantaneous power failure prior to blackout, the rotor rotation speed information of the vacuum pump 2, and the posture information signal indicating the arrangement posture of the vacuum pump 2.

(3) For example, in a case where the pump information signal includes the blackout signal indicating that the power supply to the vacuum pump 2 is stopped, when the blackout signal is input to the communication terminal 133 as the signal input section, the valve plate 11 may be moved to a danger avoidance position set in advance. For example, in the case of the process using the inflammable gas, the valve plate 11 is moved to the fully-open position C1 (the danger avoidance position) of FIG. 7 to prevent the gas pressure from increasing due to accumulation of the inflammable gas in the vacuum chamber 3. In the case of the process using the toxic gas, the valve plate 11 is moved to the fully-closed position C2 as described above. With such operation, safety of the vacuum pumping system can be improved.

(4) For example, in a case where the pump information signal includes the instantaneous power failure signal output upon instantaneous power failure prior to blackout, when the instantaneous power failure signal is input to the communication terminal 133, the operation speed of the valve plate 11 is decreased. As described above, operation prepared for blackout is preferably performed by the instantaneous power failure signal prior to blackout.

(5) For example, in a case where the pump information signal includes the posture information signal indicating the arrangement posture of the vacuum pump, the drive torque of the valve plate 11 is changed according to the posture information signal. As a result, the drive operation of the valve plate 11 can be properly performed regardless of the posture state of the vacuum pump 2, i.e., the posture state of the vacuum valve 1.

(6) The vacuum valve 1 further includes the terminal 138 as a power input section to which the power is input from the commercial power supply, and the terminal 139 as a power input section to which the regenerative power generated at the vacuum pump 2 is input during stoppage of the power supply. The pump information signal further includes the rotor rotation speed information of the vacuum pump 2, and as in the processing of FIG. 4, movement to the danger avoidance position is preferably stopped when the rotor rotation speed reaches equal to or lower than the predetermined rotation speed. As a result, the vacuum-pump-side operation by the regenerative power during stoppage of the pump can be stably performed.

(7) The vacuum valve 1 further includes the terminal 138 as the power input section to which the power is input from the commercial power supply, and the terminal 139 as the power input section to which the regenerative power generated at the vacuum pump 2 is input during stoppage of the power supply. For example, as illustrated in FIG. 11, when the blackout signal is input to the communication terminal 133, the valve plate 11 is, after the operation of the valve plate 11 has been stopped for the predetermined time (S120), moved to the initial position or the danger avoidance position set in advance. Since the operation of the valve plate 11 is stopped for the predetermined time as described above, the stop operation (the magnetic levitation operation by the regenerative power) by the regenerative power on the vacuum pump side can be stably performed.

(8) The vacuum pump 2 connected to the above-described vacuum valve 1 includes the communication terminal 230 as a signal output section configured to output the pump information signal to the vacuum valve 1. As a result, the pump information signal is received by the vacuum valve 1 side through the communication terminal 230, and therefore, the above-described control can be performed.

Further, in the valve operation (the danger avoidance operation) by the regenerative power, the vacuum valve 1 preferably operates with a lower power than that in the operation by the power from the commercial power source. This is because the regenerative power generated at the vacuum pump 2 is used for maintaining magnetic levitation using the magnetic bearing 211. Thus, the danger avoidance operation at the vacuum valve 1 needs to be performed within a range of surplus power obtained by subtracting power consumption of the magnetic bearing 211 from the generated regenerative power such that magnetic levitation by the magnetic bearing 211 is not interfered.

For this reason, in the danger avoidance operation at the vacuum valve 1, the drive speed of the valve plate 11 is, for suppressing a regenerative power use amount, preferably decreased as compared to that in the normal state, or the valve plate 11 is preferably operated in an intermittent manner. Surplus power information based on power consumption information of the magnetic bearing and generated regenerative power information is, as the pump information, input from the vacuum pump side to the valve control section 13 side, and in this manner, the above-described operation can be performed. The surplus power information is one type of information on the operation state of the vacuum pump 2 as described above, and e.g., the rotor rotation speed can be used. Moreover, e.g., an abnormal stop signal output in the case of abnormal stoppage of the vacuum pump 2 can be used as the pump information indicating the operation state of the vacuum pump 2.

Note that in description above, the DC/DC converter 227*b* is configured to convert the voltage of the regenerative power into the same voltage (e.g., DC 24 V) as that of the DC power source. However, the present invention is not limited to above, and the DC/DC converter 227*b* may be configured to convert the voltage of the regenerative power into a voltage (e.g., DC 23 V) slightly lower than the voltage of the DC power source. With this configuration, the vacuum valve 1 is operated by the power from the DC power source even in the case of a power supply from both of the terminals 138, 139. For example, even in the case of a pump stop state due to failure on the vacuum pump 2 side, the regenerative power is supplied to the terminal 138. With the above-described configuration, the regenerative power is not consumed on the vacuum valve 1 side. Thus, magnetic levitation can be reliably maintained by the regenerative power in the vacuum pump 2.

Note that as long as the features of the present invention are not impaired, the present invention is not limited to the above-described embodiments. In the above-described embodiments, it is configured such that the regenerative power is generated at the vacuum pump 2 upon blackout and part of the regenerative power is supplied to the vacuum valve 1 side. However, the present invention is not limited to the vacuum valve 1 with such a configuration. For example, the above-described operation in the vacuum valve 1 based on the pump information signal is also applicable to a vacuum valve operated by a reserve source other than the regenerative power. Moreover, in the above-described embodiments, the case of using the magnetic levitation type turbo-molecular pump as the vacuum pump has been described as an example, but the present invention is not limited to such a case.

What is claimed is:

1. A vacuum valve connected to a vacuum pump, comprising:
    a valve plate to be openably/closably driven;
    a drive section configured to openably/closably drive the valve plate;
    a signal input section to which a pump information signal indicating an operation state of the vacuum pump is input; and
    a valve control section configured to control operation of the valve plate based on the input pump information signal, wherein
    the pump information signal includes a blackout signal indicating that a power supply to the vacuum pump is stopped, and
    when the blackout signal is input to the signal input section, the valve plate is brought into an open state to prevent a gas pressure from increasing due to accumulation of an inflammable gas.

2. The vacuum valve according to claim 1, wherein
    the pump information signal further includes at least one of
        an instantaneous power failure signal output upon instantaneous power failure prior to blackout,
        rotor rotation speed information of the vacuum pump, or
        a posture information signal indicating an arrangement posture of the vacuum pump.

3. The vacuum valve according to claim 1, wherein
    the pump information signal further includes an instantaneous power failure signal output upon instantaneous power failure prior to blackout, and
    when the instantaneous power failure signal is input to the signal input section, the valve control section decreases an operation speed of the valve plate.

4. The vacuum valve according to claim 1, wherein
the pump information signal further includes a posture information signal indicating an arrangement posture of the vacuum pump, and
the valve control section changes a drive torque of the valve plate according to the posture information signal.

5. The vacuum valve according to claim 1, further comprising:
a first power input section to which power is input from a commercial power supply; and
a second power input section to which regenerative power generated at the vacuum pump is input during stoppage of the power supply,
wherein the pump information signal further includes rotor rotation speed information of the vacuum pump, and
the valve control section stops movement to the open state when a rotor rotation speed reaches equal to or lower than a predetermined rotation speed.

6. The vacuum valve according to claim 1, further comprising:
a first power input section to which power is input from a commercial power supply; and
a second power input section to which regenerative power generated at the vacuum pump is input during stoppage of the power supply,
wherein when the blackout signal is input to the signal input section, the valve plate is, after the operation of the valve plate has been stopped for a predetermined time, moved to an initial position or the open state.

7. A vacuum pump connected to the vacuum valve according to claim 1, comprising:
a signal output section configured to output the pump information signal to the vacuum valve.

8. A vacuum pumping system comprising:
the vacuum valve according to claim 1;
a vacuum pump including a signal output section configured to output the pump information signal to the vacuum valve;
a signal line connecting the signal output section of the vacuum pump and the signal input section of the vacuum valve; and
a power line connecting a regenerative power output section of the vacuum pump and a second power input section of the vacuum valve.

* * * * *